(12) United States Patent
Popovici et al.

(10) Patent No.: US 9,343,298 B2
(45) Date of Patent: May 17, 2016

(54) METAL-INSULATOR-METAL CAPACITOR AND METHOD FOR MANUFACTURING THEREOF

(75) Inventors: Mihaela Ioana Popovici, Leuven (BE); Johan Swerts, Kessel-lo (BE); Malgorzata Pawlak, Leuven (BE); Kazuyuki Tomida, Heverlee (BE); Min-Soo Kim, Leuven (BE); Jorge Kittl, Hamme-Mille (BE); Sven Van Elshocht, Leuven (BE)

(73) Assignee: IMEC, Leuven (BE)

( * ) Notice: Subject to any disclaimer, the term of this patent is extended or adjusted under 35 U.S.C. 154(b) by 555 days.

(21) Appl. No.: 13/245,247

(22) Filed: Sep. 26, 2011

(65) Prior Publication Data

US 2012/0092807 A1    Apr. 19, 2012

Related U.S. Application Data

(60) Provisional application No. 61/481,393, filed on May 2, 2011.

(30) Foreign Application Priority Data

Sep. 28, 2010 (EP) .................................. 10181359

(51) Int. Cl.
*B05D 5/12* (2006.01)
*H01L 21/02* (2006.01)
*C23C 16/40* (2006.01)
*C23C 16/455* (2006.01)
*H01L 49/02* (2006.01)

(52) U.S. Cl.
CPC ........ *H01L 21/02356* (2013.01); *C23C 16/409* (2013.01); *C23C 16/45529* (2013.01); *H01L 21/0228* (2013.01); *H01L 21/02197* (2013.01); *H01L 21/02304* (2013.01); *H01L 28/56* (2013.01)

(58) Field of Classification Search
CPC ..................... H01L 21/02197; H01L 21/02356
USPC ........................................................... 427/79
See application file for complete search history.

(56) References Cited

U.S. PATENT DOCUMENTS 7,108,747 B1     9/2006 Leskela et al.
2001/0043453 A1 * 11/2001 Narwankar et al. ........ 361/306.3
(Continued)

OTHER PUBLICATIONS

M. Popovici et al., "Atomic Layer Deposition of Strontium Titanate Films Using Sr(tBu3Cp)2 and Ti(OMe)4," J. Electrochem. Soc., 157(1), G1-G6, G2 (2010).
(Continued)

*Primary Examiner* — Austin Murata
(74) *Attorney, Agent, or Firm* — McDonnell Boehnen Hulbert & Berghoff LLP

(57) ABSTRACT

The disclosure provides a method for producing a stack of layers on a semiconductor substrate. The method includes producing a substrate a first conductive layer; and producing by ALD a sub-stack of layers on said conductive layer, at least one of said layers of the sub-stack being a $TiO_2$ layer, the other layers of the sub-stack being layers of a dielectric material having a composition suitable to form a cubic perovskite phase upon crystallization of said sub-stack of layers. Crystallization is obtained via heat treatment. When used in a metal-insulator-metal capacitor, the stack of layers can provide improved characteristics as a consequence of the $TiO_2$ layer being present in the sub-stack.

23 Claims, 10 Drawing Sheets

- TiN deposition
- ALD Ru deposition
- Ru oxidation
- ALD TiO2 deposition
- ALD Sr-rich STO deposition
- Crystallization anneal
- TiN deposition
- TiN patterning

(56) References Cited

U.S. PATENT DOCUMENTS

| | | | |
|---|---|---|---|
| 2003/0060008 A1* | 3/2003 | Hong | 438/253 |
| 2006/0151822 A1* | 7/2006 | Govindarajan | 257/300 |
| 2009/0297696 A1 | 12/2009 | Pore et al. | |
| 2010/0052024 A1* | 3/2010 | Kiyomura et al. | 257/296 |
| 2010/0072531 A1* | 3/2010 | Kittl et al. | 257/296 |
| 2010/0258903 A1* | 10/2010 | Srinivasan et al. | 257/532 |
| 2011/0021001 A1* | 1/2011 | Srinivasan et al. | 438/386 |
| 2011/0027617 A1 | 2/2011 | Matz et al. | |
| 2011/0027960 A1 | 2/2011 | Matz et al. | |

OTHER PUBLICATIONS

M.A. Pawlak et al., "Impact of bottom electrode and $Sr_xTi_yO_z$ film formation on physical and electrical properties of metal-insulator-metal capacitors," App. Phys. Lett., 98, 182902 (2011).

M.A. Pawlak et al., "Direct physical evidence of mechanisms of leakage and equivalent oxide thickness reduction in metal-insulator-metal capacitors based on $RuO_x/TiO_x/Sr_xTi_yO_z/TiN$ stacks," App. Phys. Lett., 101, 042901 (2012).

* cited by examiner

- TiN deposition
- ALD Ru deposition
- Ru oxidation
- ALD TiO2 deposition
- ALD Sr-rich STO deposition
- Crystallization anneal
- TiN deposition
- TiN patterning

METAL-INSULATOR-METAL CAPACITOR AND METHOD FOR MANUFACTURING THEREOF

CROSS-REFERENCE TO RELATED APPLICATIONS

This application claims the priority under 35 U.S.C. 119 of U.S. Provisional Patent Application No. 61/481,393, filed May 2, 2011, and European Patent Application no. 10181359.0, filed Sep. 28, 2010, each of which is hereby incorporated herein by reference in its entirety.

FIELD OF THE INVENTION

The present disclosure is related to the production of metal-insulator-metal capacitor (MIMCAP) structures for use in semiconductor devices. The main application is the use of MIMCAPs in random-access memory such as DRAM devices.

BACKGROUND OF THE INVENTION

The DRAM 3× nm node will require MIMcaps with low leakage at an equivalent oxide thickness (EOT) of 0.4 nm or lower, deposited with highly conformal atomic layer deposition (ALD) processes for compatibility with large aspect ratio structures. Hafnium- or zirconium-based dielectrics with a dielectric constant (k) lower than 40 used currently in production are incapable of meeting this requirement, and expected to be scalable only to EOT higher than 0.6 nm. The only ALD high-k dielectric films which have shown promising results for scaling below 0.6 nm are strontium titanium oxides (STO) and Al-doped rutile titanium oxide grown on Ru-based bottom electrode (BE). However, according to previously reported data for MIMcap with ALD grown dielectrics, leakage increased to values higher than $10^{-4}$ A/cm$^2$ when scaling EOT to 0.4 nm, raising a serious concern on the possibility of continuing DRAM scaling towards the 3× node.

SUMMARY OF THE INVENTION

The present invention is related to a method and devices as disclosed in the appended claims.

The invention is thus related to a method for producing a stack of layers on a semiconductor substrate, the method comprising:
  providing a substrate,
  producing on said substrate a first electrically conductive layer,
  by atomic layer deposition, producing a sub-stack of layers on said conductive layer, at least one of said layers of the sub-stack being a TiO$_2$ layer, the other layers of the sub-stack being layers of a dielectric material having a composition suitable to form a cubic perovskite phase upon crystallization of said sub-stack of layers,
  and further comprising:
    subjecting the substrate including said sub-stack of layers to a heat treatment to thereby obtain a crystallized dielectric layer on said first conductive layer,
    producing a second electrically conductive layer on said crystallized dielectric layer.
  or:
    producing a second electrically conductive layer on said sub-stack of layers,
    subjecting the substrate including said sub-stack of layers and said second conductive layer to a heat treatment to thereby obtain a crystallized dielectric layer on said first conductive layer, According to an embodiment of the method of the invention, said sub-stack of layers is produced by the following:
  By atomic layer deposition, depositing on said first conductive layer an intermediate layer of TiO$_2$,
  By atomic layer deposition, depositing on said intermediate TiO$_2$ layer, a layer of a dielectric material having a composition suitable to form a cubic perovskite phase upon crystallization.

According to another embodiment, said sub-stack of layers is produced by the following:
  By atomic layer deposition, depositing on said first conductive layer, a layer of a dielectric material having a composition suitable to form a cubic perovskite phase upon crystallization,
  By atomic layer deposition, depositing on said layer of dielectric material, said layer of TiO$_2$.

In the method of the invention, a sequence of alternating TiO$_2$ layers and dielectric layers or vice versa may be deposited by atomic layer deposition on said first conductive layer.

Said dielectric material may be STO in metastable phase, wherein the composition of said metastable STO layer is such that the crystallized dielectric layer has a ratio Sr/(Sr+Ti) higher than 50% and lower than 65%.

According to a preferred embodiment, the ratio Sr/(Sr+Ti) of said metastable STO layer is between 51% and 65%.

In the method according to the invention, said sub-stack may comprise at least one layer of strontium oxide.

According to a preferred embodiment, said thermal treatment is a thermal anneal at a temperature lower than or equal to 600° C. in an inert atmosphere.

According to an embodiment, said first conductive layer comprises at least at its top surface a material that stores excess oxygen, creating a reservoir of oxygen, and resulting in release of oxygen from the first conductive layer towards the dielectric during said heat treatment.

Furthermore, said second conductive layer may comprise at least at its bottom surface a material that stores excess oxygen, creating a reservoir of oxygen, and resulting in release of oxygen from the second conductive layer towards the dielectric during a subsequent heat treatment.

According to a preferred embodiment, said material that stores excess oxygen is ruthenium oxide.

The invention is equally related to a metal-insulator-metal (MIM) capacitor comprising:
  A bottom electrode,
  On said bottom electrode, a dielectric layer comprising a dielectric material having a cubic perovskite structure, and
  On said dielectric layer, a top electrode
wherein the k-value of said dielectric layer is between 50 and 100 and the EOT of the MIM capacitor is between 0.35 nm and 0.55 nm.

In a MIM cap according to the invention, said dielectric layer may be and STO layer with Sr/Sr+Ti higher than 50% and lower than 65%.

In a MIM cap according to the invention, said bottom electrode may comprise at least at its top surface a layer of a material that stores excess oxygen, creating a reservoir of oxygen, and resulting in release of oxygen from the first layer towards the dielectric during a subsequent heat treatment and/or said top electrode may comprise at least at its bottom surface a layer of a material that stores excess oxygen, creating a reservoir of oxygen, and resulting in release of oxygen from the first layer towards the dielectric during a subsequent heat treatment.

According to a preferred embodiment, said material that stores excess oxygen is ruthenium oxide.

BRIEF DESCRIPTION OF THE DRAWINGS

All drawings are intended to illustrate some aspects and embodiments of the present disclosure. The drawings described are only schematic and are non-limiting. In the formula $TiO_x$ used in the drawings, the value of x is 2.

DETAILED DESCRIPTION OF THE INVENTION

Figure 1:
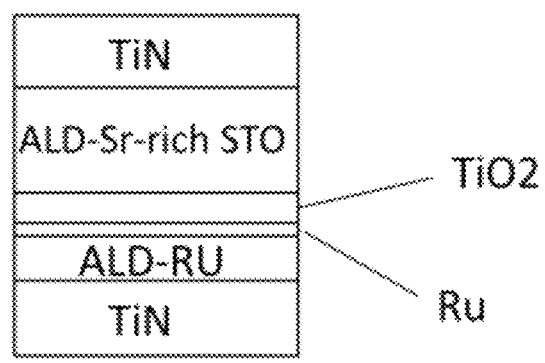
FIG. 1 illustrates schematically the process flow (top) and the MIMCap stack (bottom) fabricated in a 300 mm manufacturing line, using the stack engineering of the invention with controlled Ru oxidation and interfacial $TiO_2$ layer.

The present invention is related to a MIM capacitor with improved performance with respect to the state of the art. More specifically, it is related to a MIM capacitor suitable to be used in advanced DRAM devices such as DRAM of 3× nm node having a leakage of $10^{-6}$ A/cm$^2$ or lower for sub-0.5 nm EOT.

The invention is related to a metal-insulator-metal capacitor comprising:
A bottom electrode,
On said bottom electrode a dielectric layer comprising or consisting of a dielectric material having a cubic perovskite structure,
On said dielectric layer, a top electrode,
wherein the k-value of said dielectric layer is between 50 and 100 and the EOT of the MIM capacitor is between 0.35 nm and 0.55 nm.

According to a preferred embodiment, the bottom electrode consists of or comprises on its surface a metal layer or a metal layer covered by a layer of an oxide of said metal. In a MIMCAP according to the invention, said metal can be titanium nitride, ruthenium or any other metal suitable to form a bottom electrode. Preferably a metal is used of which the oxide has metallic characteristics so as not to contribute to the EOT. An example of such a metal is ruthenium (Ru). Said electrode therefore preferably consists of or comprises on its top surface a Ru layer or a Ru layer covered by ruthenium oxide. Possibly the bottom electrode comprises a stack of metal layers, e.g. a layer of TiN is first deposited on the substrate, and the Ru layer is deposited onto the TiN layer.

In a MIMCAP according to the invention, the dielectric layer may consist of a Sr-rich Strontium-Titanium oxide (STO), i.e. an Sr—Ti oxide (general formula $Sr_xTi_yO_z$) wherein the Sr/Ti ratio x/y is higher than 1, i.e. Sr/(Sr+Ti) is higher than 50%. Preferably in a MIMCAP according to the invention, the Sr/(Sr+Ti) ratio of the crystallized material, referred herein below as final Sr/(Sr+Ti) ratio is higher than 50% and lower than 65%, more preferably between 55% and 62% and even more preferably between 58% and 61%. Sr-rich STO layers (e.g. Sr/(Sr+Ti) at about 62%) have better leakage properties than stoichiometric STO films. This is due to the formation of large STO grains (with a grain size larger than 500 nm) with nano-cracks and star-shape patterns (as observed by SEM) in crystallization of stoichiometric films, while small grain size (grain size of about 50 nm) crack-free films are obtained upon crystallization of Sr-rich STO. So far in the prior art however, it was not possible to obtain a MIMcap with a Sr-rich STO dielectric layer that had a k-value of more than 50 combined with EOT lower than 0.4 nm. A MIMcap according to the invention has a dielectric layer with a k-value between 50 and 100 and has an EOT between 0.35 nm and 0.55 nm. This is achieved by performing the method of the invention as described hereafter.

The invention is thus equally related to a method for producing a stack of layers on a semiconductor substrate, suitable for producing a MIMCAP as described above, the method comprising:
Providing a substrate,
producing on said substrate a first conductive layer, preferably a metal layer, or a metal layer covered by an oxide of said metal,
producing a sub-stack of layers by ALD on said first conductive layer, at least one of said layers of the sub-stack being a $TiO_2$ layer, the other layers of the sub-stack being layers of a dielectric material having a composition suitable to form a cubic perovskite phase upon crystallization of said sub-stack of layers,
subjecting the substrate including said sub-stack of layers to a heat treatment to thereby obtain a crystallized dielectric layer on the first conductive layer,
producing a second electrically conductive layer on said crystallized dielectric layer.

The first and second conductive layers can themselves consist of a stack of conductive layers. Alternatively, the second conductive layer may be produced on the sub-stack of layers as described above, and the heat treatment applied to the substrate including the sub-stack and the second conductive layer.

In the context of the present disclosure and without being bound by theory, it is understood that upon subjecting the sub-stack to a heat treatment, an intermixing takes place and a dielectric layer with a cubic perovskite structure is formed. The at least one $TiO_2$ layer intermixes with the other layers to thereby form a dielectric layer between the first and second conductive layer. The $TiO_2$ layer increases the Ti-content of the dielectric layer while not affecting its microstructure. This allows obtaining a MIMcap with superior quality in terms of the k-value, leakage and EOT. Said intermixing results in a uniform STO layer with higher Ti content and consequently higher k-value. The final STO composition of a fully intermixed stack depends on the deposited thicknesses of the various layers in the sub-stack.

According to one embodiment, the method of the invention comprises:
Providing a substrate,
producing on said substrate a first conductive layer, preferably a metal layer, or a first metal layer covered by an oxide of said metal,
By atomic layer deposition, depositing on said first conductive layer an intermediate layer of $TiO_2$,
By atomic layer deposition, depositing on said $TiO_2$ layer, a layer of a dielectric material, to thereby obtain a sub-stack of a $TiO_2$ layer and a second dielectric layer, said dielectric material having a composition suitable to form a cubic perovskite phase upon crystallization of the stack formed of said $TiO_2$ layer and said second dielectric layer,
subjecting the substrate including said sub-stack to a heat treatment to thereby obtain a crystallized dielectric layer,
producing a second conductive layer on said crystallized dielectric layer.

In alternative embodiments said second dielectric layer is deposited first, overlying and in contact with said first conductive layer. The $TiO_2$ layer is deposited second, overlying and in contact with the second dielectric layer and underlying the second conductive layer.

Yet in other embodiments sub-layers of the $TiO_2$ layer and sub-layers of the second dielectric layer are formed alternately.

The second dielectric layer can be a Sr-rich STO or other suitable material, i.e. other dielectric materials which are suitable to form a cubic perovskite structure upon crystallization. An example of such a material is $Ba_pSr_{1-p}Ti_xO_y$, with p<0.5.

According to another embodiment, the sub-stack may comprise, besides the one or more $TiO_2$ layers, layers of a material which in itself does not form a perovskite phase upon crystallization, preferably combined in the sub-stack with layers that do form such a phase upon crystallization. For example, the sub-stack may contain one or more layers of SrO and one or more layers of STO. The layer of SrO in itself does not form a perovskite phase upon crystallization, but the combined stack of SrO and STO does form such a phase. The function of the SrO is then to control the final composition of the cubic perovskite phase.

According to a preferred embodiment, the thermal treatment is a rapid thermal process (RTP) anneal in $N_2$ or other inert ambient at a temperature lower than or equal to about 600° C. Preferably the thermal anneal is performed after depositing said sub-stack of layers, and before forming the second conductive layer.

During or after the ALD of the sub-stack, dopants may be added to the dielectric layer, according to known doping methods. The dopants can be chosen from the group consisting of: Sr, Ti, Ta, Al, Hf, Gd, Zr, Sc, Dy.

According to a preferred embodiment described hereafter in more detail, the dielectric layer that is present between the first and second conductive layers after the heat treatment step, is a Sr-rich STO layer. The Sr-rich STO layer is formed upon applying a thermal treatment to a stack of dielectric layers consisting of and arranged in random order from bottom to top: at least one $TiO_2$ layer, at least one sub-layer of metastable phase STO and possibly at least one layer of strontium oxide (SrO). The Sr/(Sr+Ti) final ratio is the Sr/(Sr+Ti) ratio after annealing. A metastable phase STO layer is a layer that is either Sr rich or Ti rich. A Ti-rich STO layer is a layer wherein the ratio Sr/Sr+Ti is lower than 50%, preferably between 40% and 49%. In that case, the use of one or more SrO layers in the sub-stack is required so that the final dielectric layer is a Sr-rich STO (ratio Sr/Sr+Ti higher than 50%).

The metastable phase STO may be formed by ALD deposition of a STO material with the Sr/(Sr+Ti) ratio between 51% and 65%. More preferably the Sr/(Sr+Ti) ratio of the as-deposited metastable phase is between 55% and 65%, even more preferably between 58% and 62%.

In the embodiments wherein a STO metastable phase with less than 58% Sr/(Sr+Ti) is deposited, a layer of SrO can be deposited either underlying and/or overlying the STO, such that upon a thermal treatment the final Sr/(Sr+Ti) ratio is reached. Preferably, the thickness of the SrO layer is lower or equal to 2 nm.

Alternatively, a more homogeneous distribution can be obtained by alternating sub-layers of metastable STO with sub-layers of SrO. Preferably, the total thickness of the different SrO sub-layers is lower or equal to 2 nm.

In the embodiments wherein a STO metastable phase with more than 55% Sr/(Sr+Ti) is deposited, said layer of $TiO_2$ can be deposited either underlying and/or overlying the STO, such that upon a thermal treatment the targeted Sr/(Sr+Ti) ratio is reached. Preferably, the thickness of the $TiO_2$ layer is lower or equal to 2 nm.

Alternatively, a homogeneous distribution can be obtained by alternating sub-layers of metastable STO with sub-layers of $TiO_2$. Preferably, the total thickness of the different $TiO_2$ sub-layers is lower or equal to 2 nm.

The top electrode made of a second conductive layer may be a Ru or a TiN layer or any other suitable layer.

In prior art MIMcaps, the bottom electrode scavenges (takes/captures) oxygen from the dielectric during the dielectric crystallization anneal, resulting in defects in the dielectric associated with oxygen deficiency (e.g. oxygen vacancies), which increase the trap density in the dielectric and thus the leakage in the capacitor.

According to a preferred embodiment of the present invention, a bottom electrode is used which, on the contrary to the above mentioned scavenging mechanism, stores excess oxygen (at least at the top surface of the bottom electrode) which can be released to the dielectric during the crystallization anneal, thus "healing" the defects and reducing the leakage. The bottom electrode behaves as a reservoir of oxygen which is released to the dielectric during the crystallization anneal, thus healing the defects and reducing the leakage.

An example of this type of electrodes is oxidized Ru. In the embodiments of the low pressure oxidized Ru electrode (i.e. first conductive layer with a ruthenium oxide layer on top), excess oxygen is stored that is then released to the STO during crystallization anneal. Other noble metals or near noble metals or their oxides (preferably obtained by an oxidizing anneal) could function in the same way. Illustrative examples of such materials suitable to form the bottom electrode are: Pt, $IrO_x$ and any mixtures or combinations thereof.

Similarly, for the top electrode (second conductive layer), materials that are deposited in an oxidizing ambient and/or with processes that result in excess oxygen in the conductive layer, or at least at the bottom surface of the top electrode, are preferred. This prevents scavenging from the top electrode during further processing, and may even reverse the effect resulting in additional oxygen incorporation, i.e. further "healing" of the dielectric during subsequent processing, in the region of the dielectric in the vicinity of the top electrode.

While the invention has been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. When it is stated in this description that a layer is produced 'on' another layer, this preferably means that the layer is on and in contact with said other layer, though it is not excluded that intermediate layers are present between the two layers. The mere fact that certain measures are recited in mutually different dependent claims does not indicate that a combination of these measures cannot be used to advantage. Any reference signs in the claims should not be construed as limiting the scope.

The foregoing description details certain embodiments of the invention. It will be appreciated, however, that no matter how detailed the foregoing appears in text, the invention may be practiced in many ways, and is therefore not limited to the embodiments disclosed. It should be noted that the use of particular terminology when describing certain features or aspects of the invention should not be taken to imply that the terminology is being re-defined herein to be restricted to include any specific characteristics of the features or aspects of the invention with which that terminology is associated.

EXAMPLES

Test Results

In a first series of experiments, MIM capacitors were fabricated in a 300 mm line. The flow sequence and a schematic cross-section of the MIMcap stack are shown in FIG. 1.

Ruthenium films with a thickness of 5 nm were deposited by ALD with excellent smooth surfaces (lower than 0.2 nm RMS by AFM) on 10 nm TiN. Some wafers were left without Ru, i.e. with TiN bottom electrode (BE), for comparison.

Figure 2:
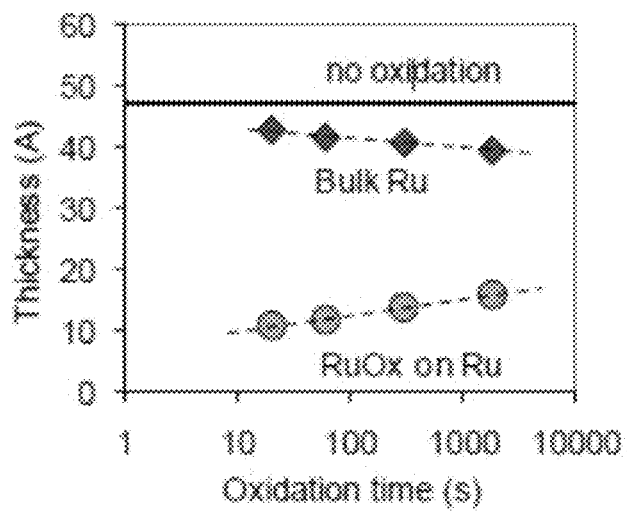
FIG. 2 represents the controlled Ru oxidation process, showing evolution of Ru and RuOx thicknesses as determined by XRR (X-ray reflectivity). Smooth films are obtained without large RuOx crystals or surface roughening.

A controlled oxidation process as shown in FIG. 2 was applied to the wafers with Ru BE, resulting in ultrathin, controlled oxidation of the surface forming a 1 nm ruthenium oxide (hereafter called 'RuOx') layer with no penalty in roughness (i.e. maintaining a value lower than 0.2 nm RMS by AFM). This controlled oxidation is obtained by subjecting the Ru bottom electrode layer to a low-pressure atmosphere consisting of $O_2$ or consisting of a mixture of $O_2$ and one or more inert gases such as $N_2$. The pressure or partial pressure of $O_2$ is between 1 mTorr and 10 Torr (i.e. between 0.13 Pa and 1333.22 Pa). The temperature during oxidation is between 200° C. and 450° C. The oxidation time is between 1 min and 30 min, with lower oxidation times being applicable for higher temperatures.

Previously reported oxidation processes result in either formation of large RuOx crystals or significant roughening of the film surface, both unacceptable for DRAM MIMcap manufacturing.

A thin $TiO_2$ interfacial layer with a thickness of 0.5 or 1 nm, was then grown by ALD at 250° C. with $Ti(OCH_3)_4$ and $H_2O$ as oxidant. Some wafers were kept without the $TiO_2$ interfacial layer for comparison.

Figure 3:
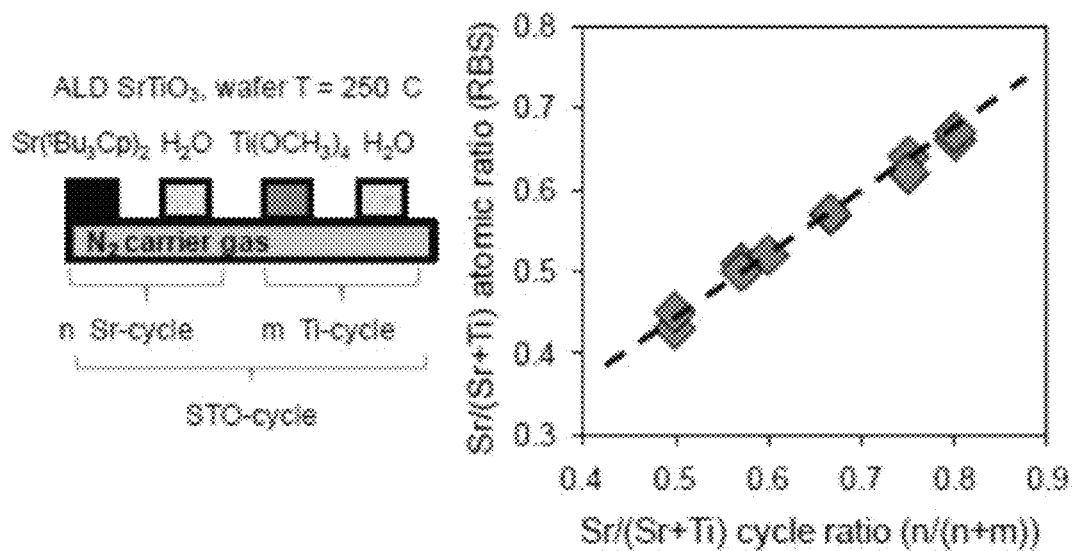
FIG. 3 (a) shows schematically the STO ALD deposition; (b) STO composition control by varying the Sr to Ti pulse ratio.

STO films with a thickness of 7 to 9 nm were then deposited by ALD at 250° C. using $Sr(t-Bu_3Cp)_2$ and $Ti(OCH_3)_4$ precursors and $H_2O$ as oxidant. Good composition control over a large Sr/Ti range is obtained by adjusting the Sr to Ti pulse ratio as shown in FIG. 3.

Figure 4:
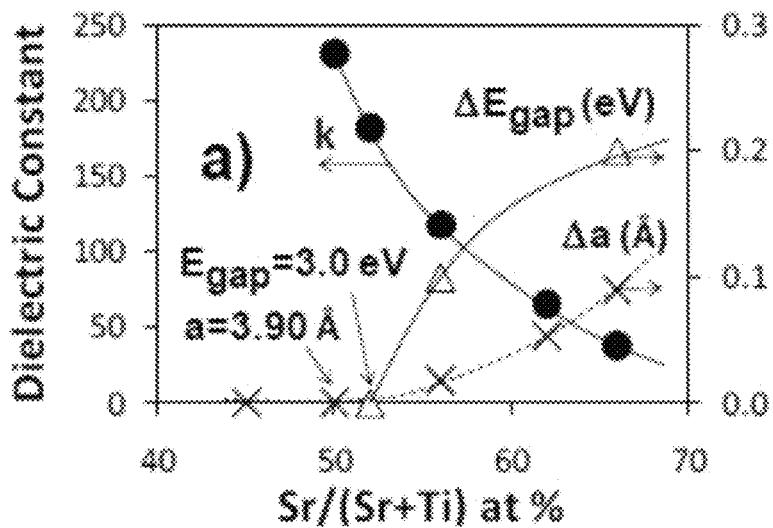
FIG. 4 shows the properties (permittivity, band gap and lattice parameter) of metastable perovskite STO films as a function of Sr content.

Films were crystallized by rapid thermal processing (RTP) annealing in $N_2$ at a temperature lower or equal to 600° C. The properties of crystallized STO films depend on the composition, as shown in FIG. 4 for films without $TiO_2$ interface layer, with k-value decreasing and lattice parameter increasing with increasing Sr. Only a small change is observed in band gap value.

Figure 5:
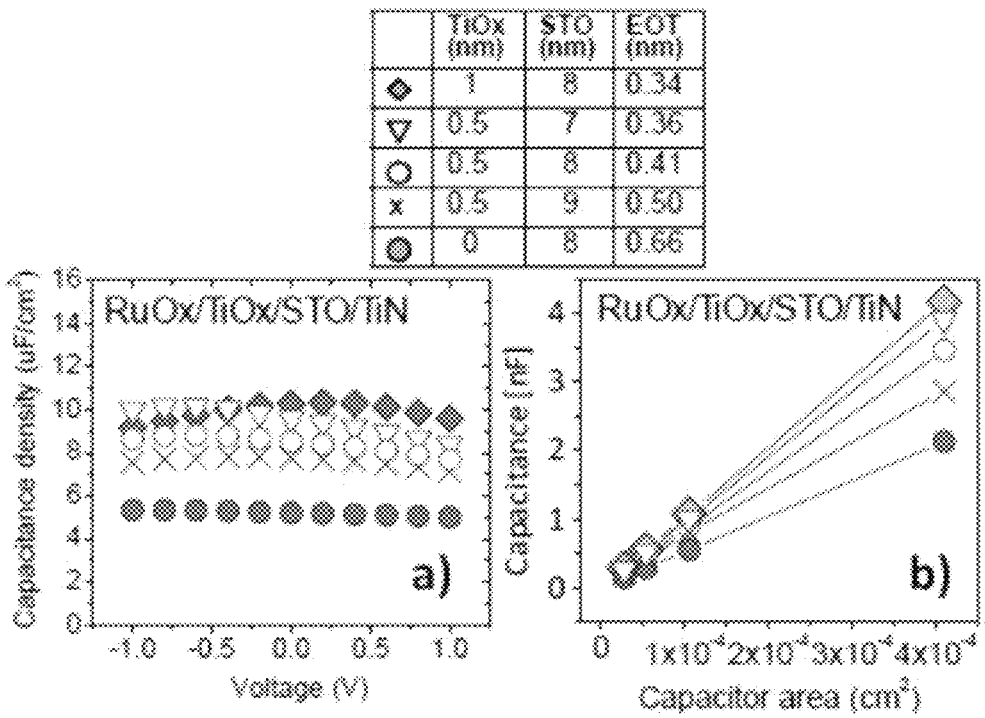
FIG. 5 shows (a) CV characteristics and (b) capacitance vs. area characteristics of TiN/Ru/RuOx/$TiO_2$/STO/TiN MIM-Caps, showing well behaved CVs with good area scaling. Layer thicknesses and extracted EOT values are shown in the legend on top.

After crystallization and top electrode (TE) processing (TiN patterned by reactive ion etching RIE), films were characterized electrically. EOT values were extracted from CV measurements as shown in FIG. 5.

Well behaved CVs and excellent area scaling was found. EOT increases with increasing deposited STO thickness as shown in FIG. 6(a). The apparent k-value extracted from the slope of this plot (for $TiO_2$=0.5 nm), k about 85, is higher than expected for Sr-rich STO (without the $TiO_2$ layer (see FIG. 4), the obtained k-value is about 65 at Sr/(Sr+Ti)=62%).

An even more important observation, however, is that EOT was found to decrease with increasing deposited interfacial $TiO_2$ thickness for the same STO thickness as shown in FIG. 6(b).

Figure 7:
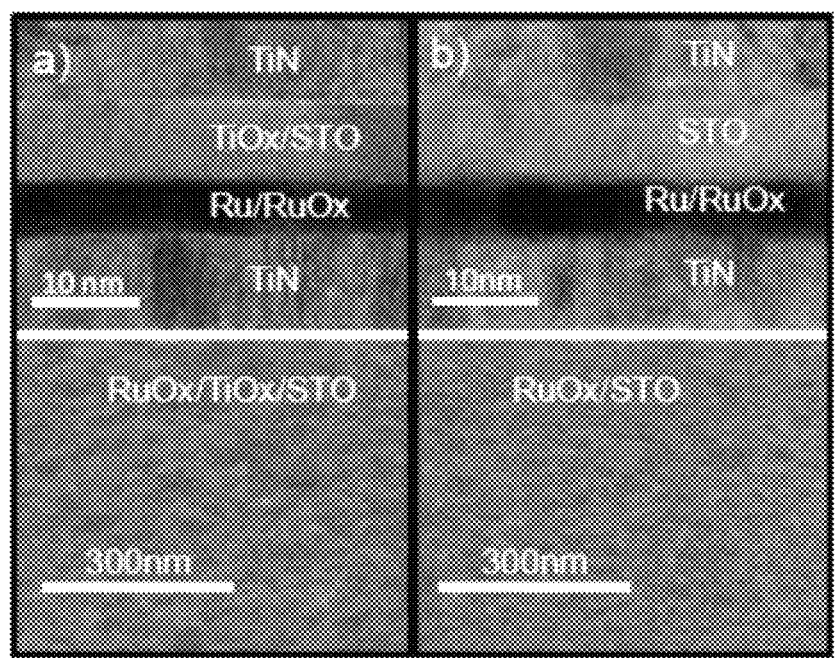
FIG. 7 shows (top) cross section TEM images after crystallization anneal and TiN top electrode (TE) processing of MIMCap stacks; and (bottom) SEM top view images after crystallization anneal for: (a) TiN/Ru/RuOx/$TiO_2$/STO deposited stack with 0.5 nm $TiO_2$ and (b) TiN/Ru/RuOx/STO deposited stack (without $TiO_2$). No differences in microstructure are observed between the two stacks despite the significant reduction in EOT obtained with the $TiO_2$ layer.

TEM characterization of MIM stacks after the crystallization anneal, and TiN TE processing with and without 0.5 nm TiO$_2$ interfacial layer showed no observable difference as shown in FIG. 7(a).

In both cases, grain size remains small (smaller than/equal to 50 nm). Similarly, no difference was observed by top view SEM analysis between stacks with and without 0.5 nm interfacial TiO$_2$ after crystallization anneal as shown in FIG. 7(b).

Figure 8:
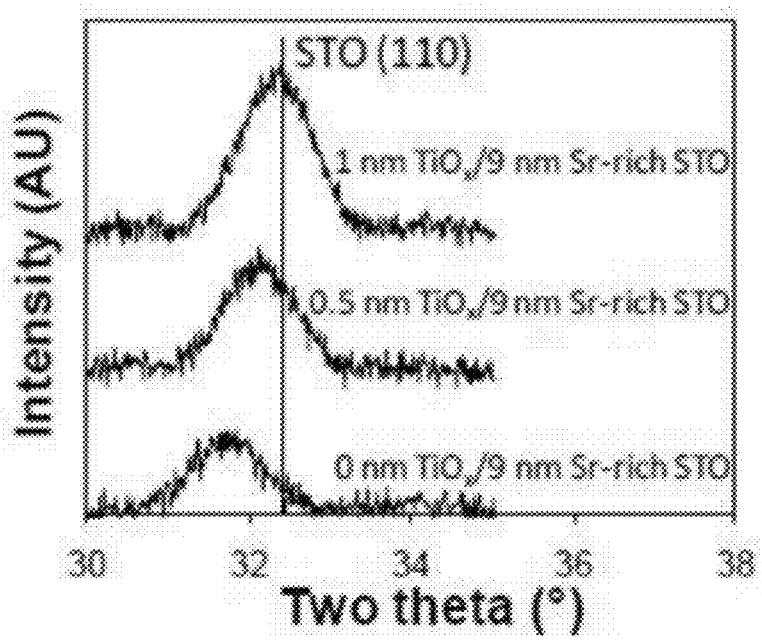
FIG. 8 shows the X-ray diffraction pattern of TiN/Ru/RuOx/$TiO_2$/Sr-rich STO stacks after crystallization anneal, for varying $TiO_2$ thickness. The peak position of STO shifts with $TiO_2$ thickness indicating a change in lattice parameter. The vertical line corresponds to the position of the bulk stoichiometric STO (110) diffraction.

XRD analysis, however, revealed STO peak shifts correlated to the deposited interfacial TiO$_2$ thickness as shown in FIG. 8. This indicates that the composition of the STO films after crystallization changes with TiO$_2$ thickness, and can be understood in terms of the intermixing of TiO$_2$ and STO layers during crystallization anneal as shown in FIG. 9.

Figure 6:
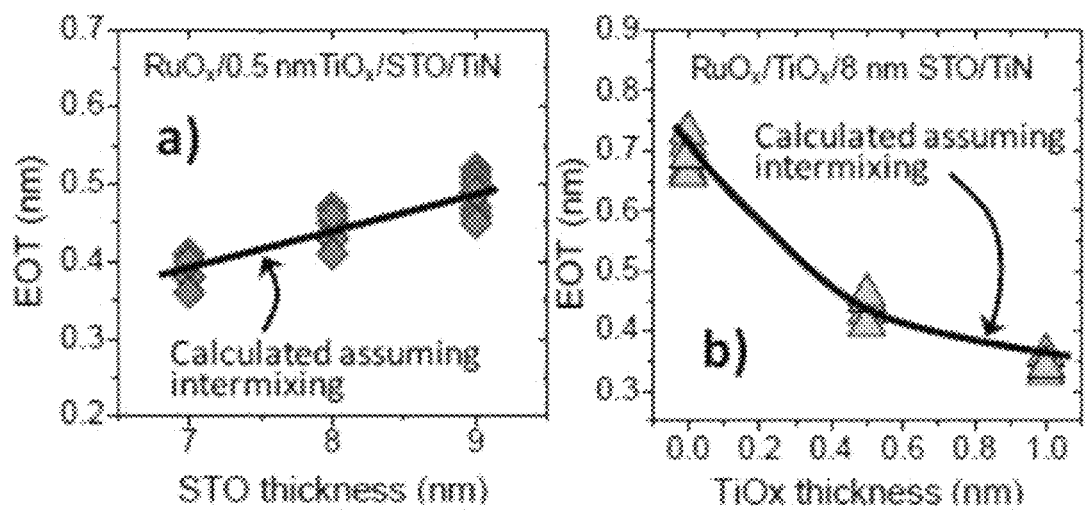
FIG. 6 shows (a) EOT vs. deposited STO thickness for a stack with 0.5 nm $TiO_2$ interfacial layer; and (b) EOT vs. deposited $TiO_2$ thickness for stack with 8 nm STO. Symbols correspond to measured data and the solid line to calculations assuming mixing of the $TiO_2$ and STO layers during crystallization (resulting in higher Ti-content STO and higher k-value).
Figure 9:
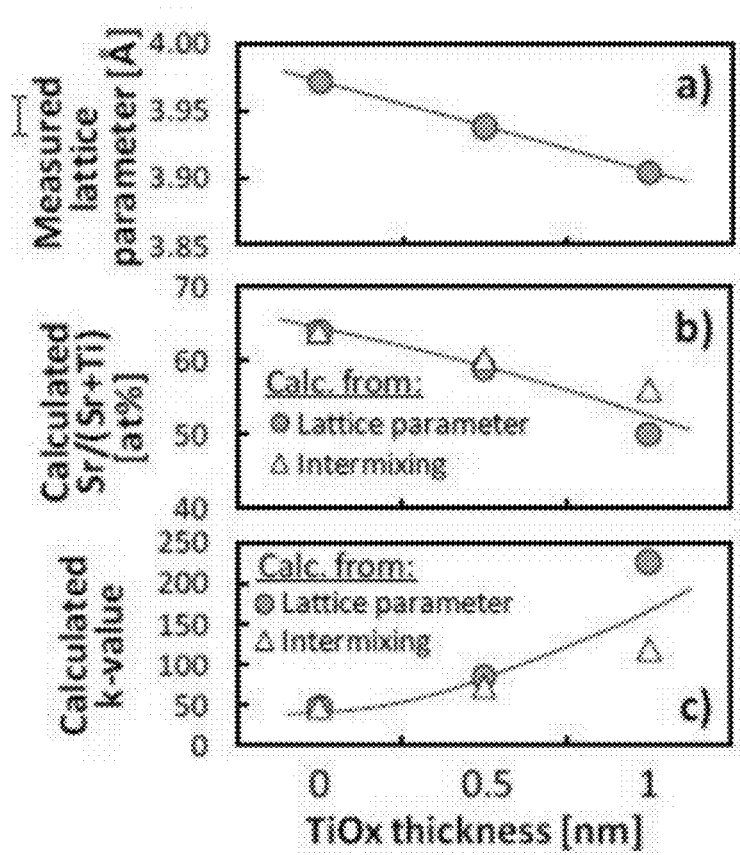
FIG. 9 shows (a) STO lattice parameter extracted from XRD data in FIG. 8 vs. $TiO_2$ thickness; (b) resulting STO composition as calculated (using correlations in FIG. 4) from the measured lattice parameter shift or by assuming intermixing of the $TiO_2$ and Sr-rich STO layers, (c) k-values corresponding to the calculated compositions (using correlations in FIG. 4). EOTs estimated using mixing model fit well with measured values (FIG. 6).

Due to the intermixing, the resulting crystallized films have higher Ti content than the deposited STO films, and in consequence a higher k-value and lower EOT as shown in FIGS. 9 and 6. However, the films keep the favorable microstructure of the Sr-rich films.

Figure 10:
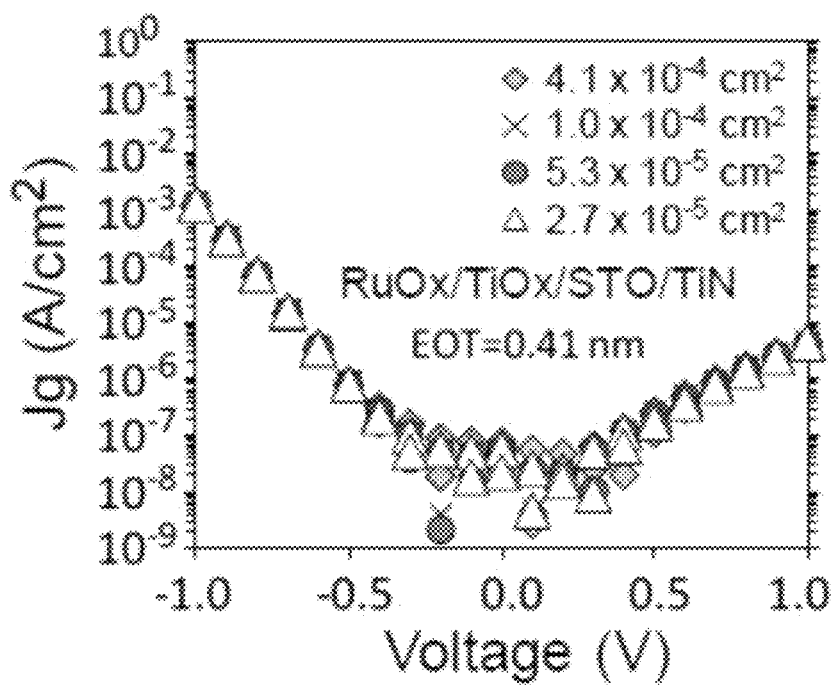
FIG. 10 shows the leakage/area vs. voltage V for TiN/Ru/RuOx/$TiO_2$/Sr-rich STO/TiN MIMcaps of different areas fabricated with 0.5 nm $TiO_2$. Excellent area scaling is observed.
Figure 11:
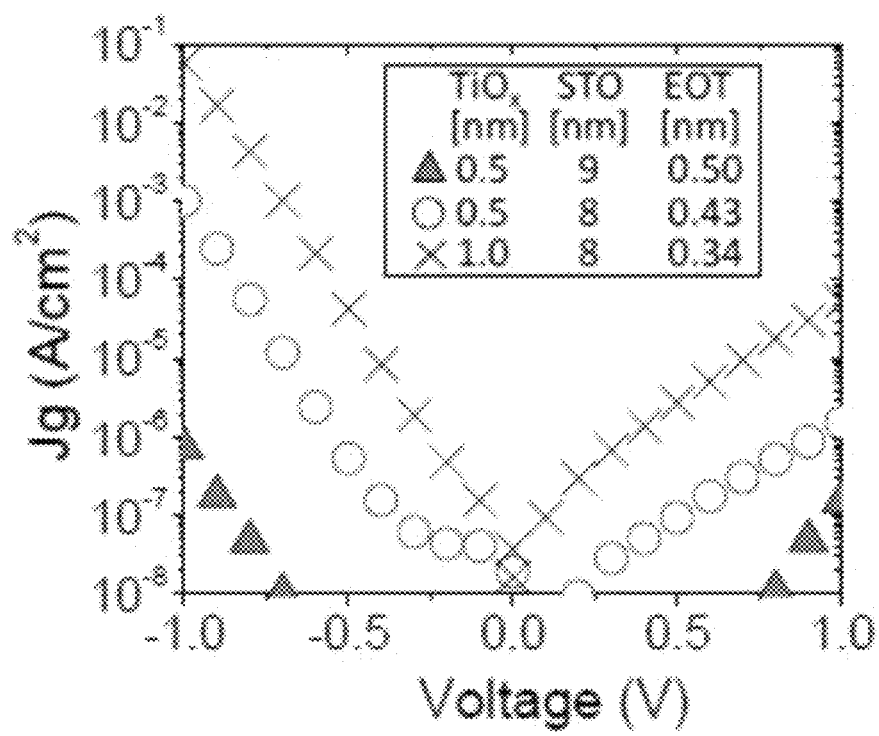
FIG. 11 shows leakage density vs. voltage V for TiN/Ru/RuOx/$TiO_2$/Sr-rich STO/TiN MIMcaps. Positive voltages correspond to electron injection from the bottom RuOx electrode and negative polarity to electrons injection from the top TiN electrode. Leakage becomes more asymmetric for thinner EOT values.

IV characteristics showed excellent area scaling as represented in FIG. 10. Typical leakage density vs. voltage (V) plots are shown in FIG. 11. As EOT decreases, leakage becomes more asymmetric, with lower leakage obtained in positive polarity corresponding to injection from RuOx. This is attributed to the higher work function (WF) of RuOx compared to the TiN top electrode.

Figure 12:
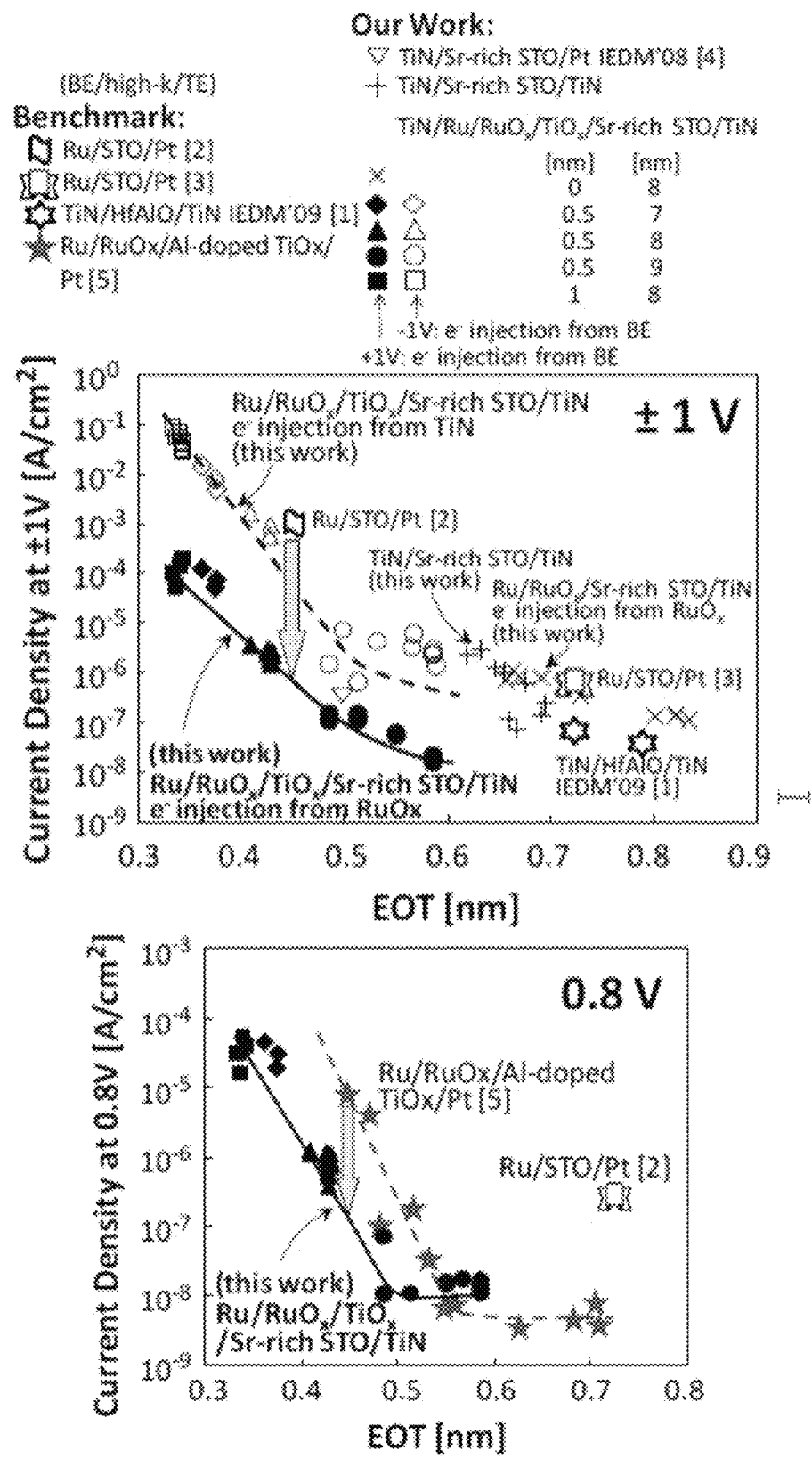
FIG. 12 shows the area leakage density vs. EOT (top: ±1 V, bottom: 0.8 V), comparing Ru/RuOx/$TiO_2$/STO/TiN stacks (this disclosure) to best literature data (benchmark) showing significant improvement.

Jg-EOT plots are shown in FIG. 12, where data according to the invention are compared to best literature data for benchmarking. It is observed that the addition of TiO$_2$ layer results in a large decrease in EOT without much penalty in leakage. Low leakage values of Jg of $10^{-6}$ A/cm$^2$ and $10^{-8}$ A/cm$^2$ are achieved for EOT of 0.4 nm and 0.5 nm, respectively at 0.8 V. These values are compared favorably with the state of the art MIMcaps with ALD grown high-k dielectrics, representing more than 100×Jg reduction at 0.4 nm EOT.

As described earlier, the use of RuOx as bottom electrode instead of TiN or Ru provides a great advantage for leakage reduction. In this way leakage is reduced in both polarities for capacitors with TiN top electrodes. The improvement is due to the impact of the bottom electrode on STO dielectric quality, i.e. trap distribution, due to differences in oxygen scavenging during crystallization anneal.

In a further set of experiments, Sr-rich STO films (7-10 nm) were deposited on thin (0, 0.5, 1 nm) TiO$_2$ layers on various bottom electrodes: TiN, Ru, RuO$_x$. The RuO$_x$ bottom electrode was formed by low pressure oxidation of Ru at 250° C., resulting in a thin (1 Nm) RuO$_2$ layer on top of the Ru film. Both dielectrics were deposited by ALD, using Sr(tBu$_3$Cp)$_2$ and Ti(OMe)$_4$ as metal precursors and H$_2$O as oxidizer, at 250° C. As deposited STO films are amorphous with k value<20. In order to achieve higher k value the STO films were crystallized into the perovskite phase by rapid thermal processing (RTP) at 600° C. in N$_2$ for 60 s. For electrical characterization, TiN top electrodes were then deposited and patterned, forming MIM capacitors.

Figure 13:
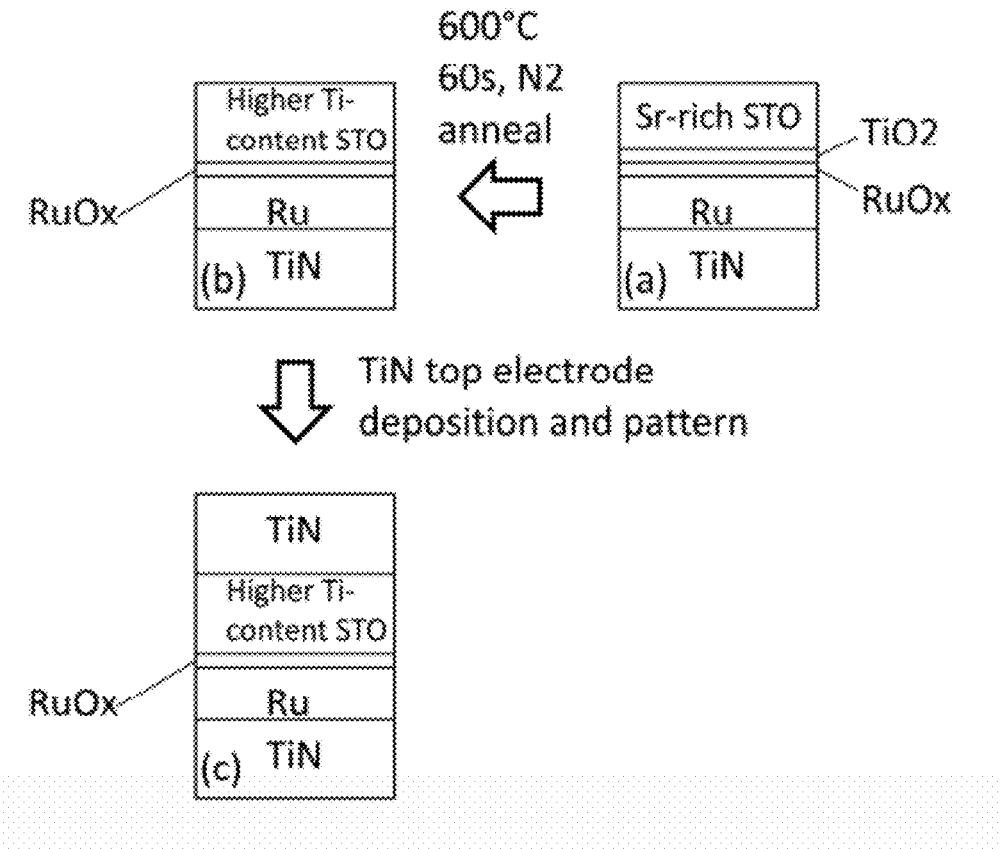
FIG. 13 shows a schematic cross-section of the capacitor stack after dielectric deposition (a), crystallization anneal (b), TiN deposition and etch (completed capacitor) (c).

FIG. 13(a) shows the schematic cross section of a sample with RuO$_x$ bottom electrode and TiO$_2$/Sr-rich STO dielectric stack, after dielectric deposition.

Figure 14:
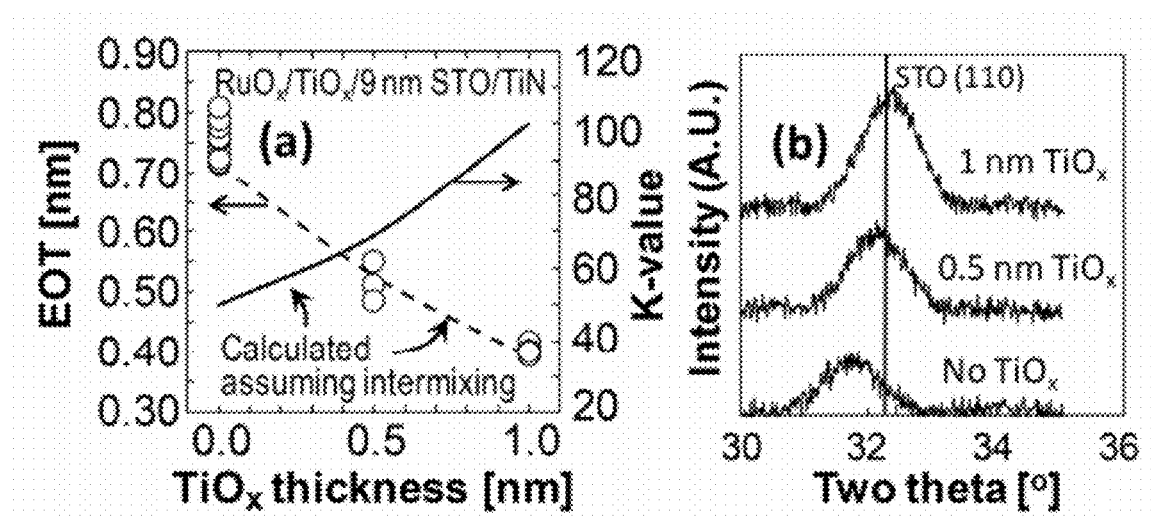
FIG. 14 shows a) EOT vs. deposited $TiO_2$ thickness and corresponding dielectric constant (symbols correspond to measured data and solid line to calculations assuming mixing of the $TiO_2$ and STO layers during crystallization); b) XRD patterns after crystallization anneal for varying deposited $TiO_2$ thickness.

FIG. 14(a) shows the EOT as function of deposited TiO$_2$ thickness for MIM capacitors with RuO$_x$ bottom electrodes and 9 nm (deposited) Sr-rich STO. A strong decrease in EOT is observed with increasing TiO$_2$ thickness. X-ray diffraction (XRD) patterns of the same dielectric stacks on RuOx, taken after crystallization anneal showed crystalline peaks corresponding to metastable perovskite STO, with no evidence of crystalline TiO$_2$ peaks. The 2-theta position of the STO (110) XRD peak is seen in FIG. 14(b) to increase with increasing TiO$_2$ layer thickness, indicating a corresponding decrease in lattice parameter. Both effects, the decrease in EOT and the decrease in lattice parameter can be explained by intermixing of the TiO$_2$ and Sr-rich STO layers during the crystallization anneal, resulting in a uniform STO layer with higher Ti content and consequently higher k-value (shown schematically in FIG. 13).

The final STO composition of a fully intermixed stack depends on the deposited thicknesses of both STO and TiO$_2$ layers, and varies in the range of Sr/(Sr+Ti)~54-64% for the stacks explored in this set of experiments. The EOT of a fully intermixed layer can be calculated based on the known deposited Ti and Sr areal atomic concentrations as determined by Rutherford Backscattering Spectrometry (RBS), film thickness and densities as extracted from X-ray reflectivity analysis (XRR) and reported k-value dependence on STO Sr content. An excellent agreement is obtained between experimental EOT vs. TiO$_2$ thickness values and those calculated assuming full intermixing of the layers for all stacks studied (shown for stacks with 9 nm deposited STO thickness in FIG. 14(a)). Furthermore, the corresponding lattice parameters determined from the XRD spectra in FIG. 14(b) are also in good agreement with those expected for the calculated compositions of intermixed films (not shown), considering the lattice parameter-composition relation previously reported. Scanning electron microscope (SEM) studies performed after crystallization anneal as well as TEM studies performed after completion of the MIM structure showed no visible impact of the TiO$_2$ layer on the microstructure of the STO films, which maintained the small grain size characteristic microstructure of Sr-rich films, which is favorable for low leakage.

Figure 15:
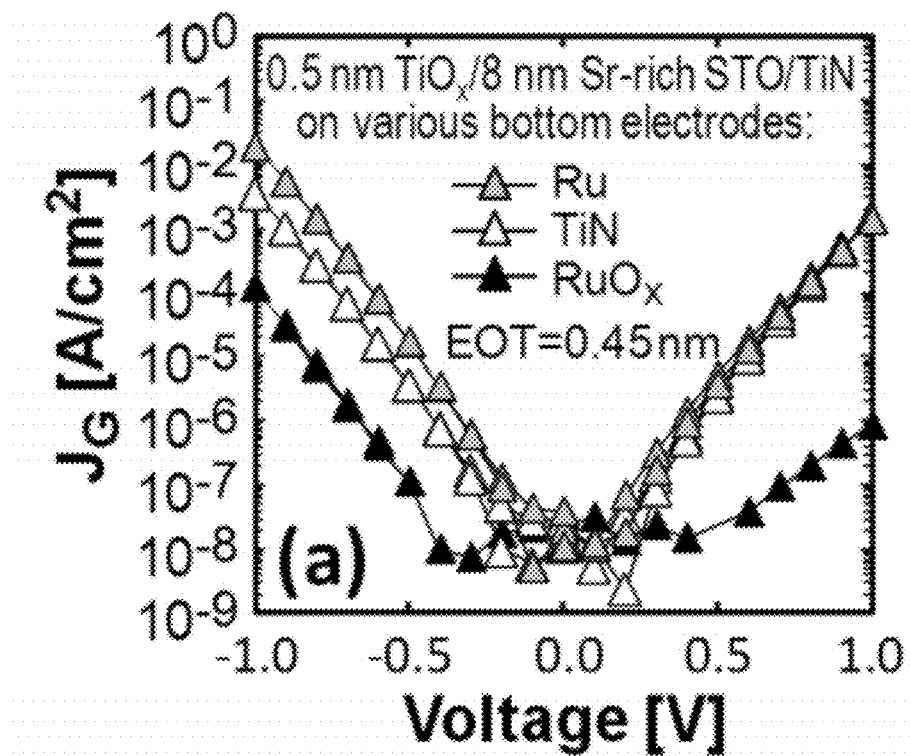
FIG. 15 shows Jg vs. voltage (V) of completed MIM capacitors comparing the same deposited dielectric stack on various BE (a), and for optimal stacks on RuOx BE (b).
Figure 15:
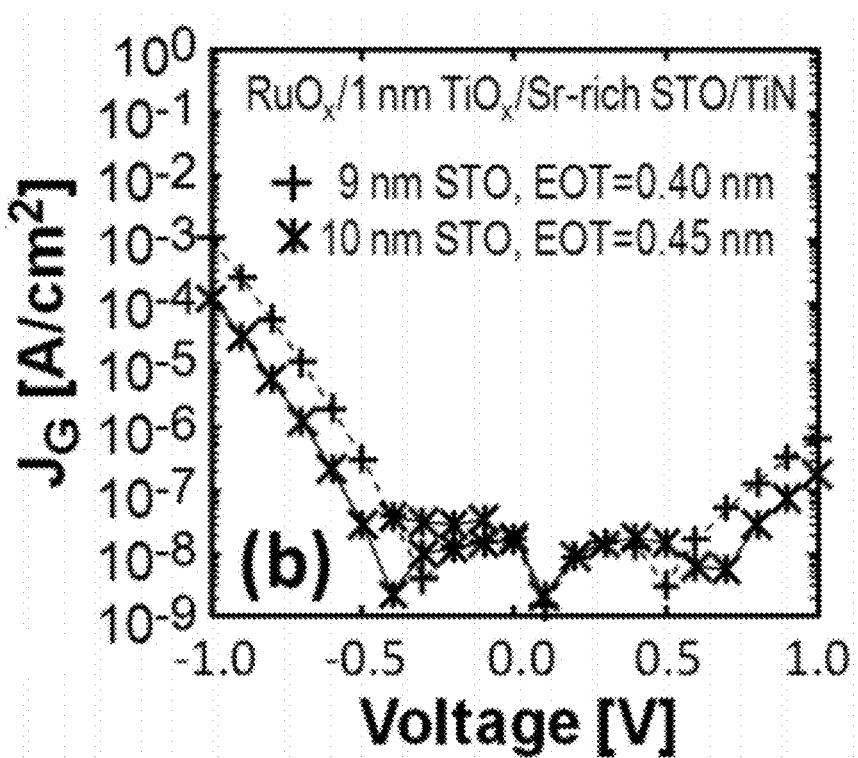
Figure 16:
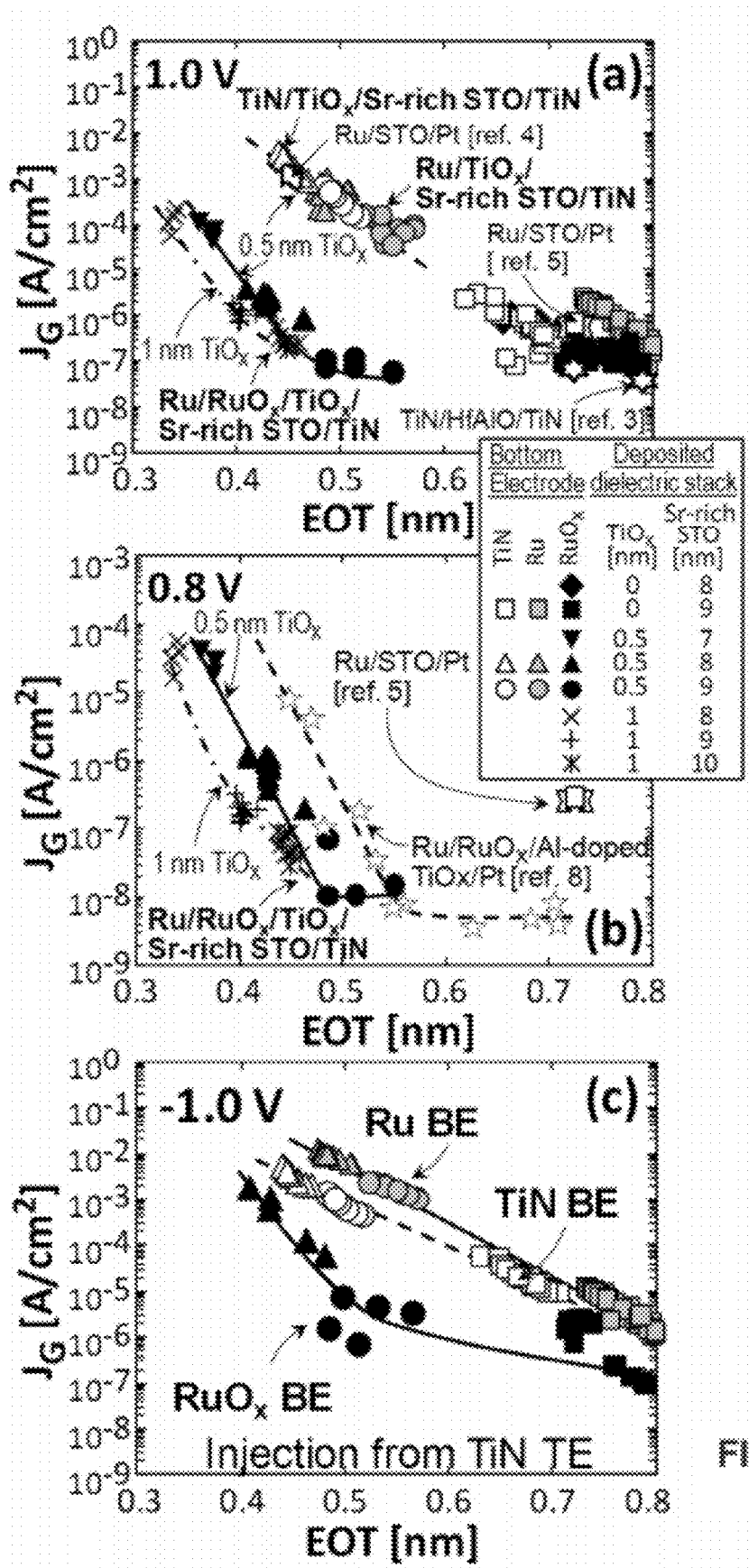
FIG. 16 shows Jg vs. EOT at 1.0 V (a), 0.8 V (b) and −1.0 V (c), comparing results of this disclosure with literature benchmarks.

Jg-V plots for a 0.5 nm TiO$_2$/8 nm STO deposited stack (resulting in EOT=0.45 nm), and Jg-EOT plots for all stacks in this embodiment, comparing TiN, Ru and RuO$_x$ bottom electrodes are shown in FIG. 15 (a) and FIG. 16 respectively. EOT trends are similar for all bottom electrodes, and consistent with TiO$_2$/STO intermixing during anneal. Slightly lower EOTs obtained in some cases on TiN bottom electrode (BE) may be attributed to slight (unintentional) oxidation of the TiN, which results in additional incorporation of some Ti into STO (i.e intermixing of native oxide on TiN with STO). Considering the Jg-EOT behaviour at +1 V (FIG. 16 (a)), it becomes apparent that TiN and Ru BE follow the same trendline. Comparing to results for deposited stoichiometric STO on TiN (1 A/cm$^2$ (1 V) at 0.5 nm EOT), it shows 4 orders of magnitude Jg improvement (to $10^{-4}$ A/cm$^2$ (1 V) at EOT=0.5 nm) for TiN/STO/TiN MIM capacitors with the films obtained by intermixing TiO$_2$/STO in this embodiment, attributed to their better microstructure.

The largest improvement in leakage, however, was obtained when changing the bottom electrode from TiN or Ru to RuO$_x$ (FIG. 15 and FIG. 16). As shown in FIG. 16 (a), at +1 V (e-injection from BE), MIM capacitors with deposited TiO$_2$/STO dielectric stacks and RuOx bottom electrode result in more than 3 orders of magnitude Jg reduction at the same EOT compared to the same dielectric stacks on TiN or Ru bottom electrodes (e.g. at 0.50 nm EOT: from $10^{-4}$ A/cm$^2$ for 0.5 nm TiO$_2$/9 nm STO on TiN or Ru BE to $10^7$ A/cm$^2$ on RuO$_x$ BE). FIG. 15 (b) shows the comparison of the JG (EOT) trend lines at +0.8 V obtained from the stacks of the disclosure (RuOx/1 nmTiO$_2$/STO/TiN—crosses, RuOx/0.5 nm TiO$_2$/STO/TiN—full symbols) with benchmark literature data (RuOx/Al doped Rutile TiO$_2$/Pt—stars, and Ru/STO/Pt), showing more than 2 orders of magnitude Jg reduction at 0.45 nm EOT with RuOx/TiO$_2$/STO stacks. The leakage at 0.45 nm EOT improves from $10^{-5}$ A/cm$^2$ obtained for Al-doped Rutile TiO$_2$ to $10^{-7}$ A/cm$^2$ with RuOx/0.5 nm TiO$_2$/STO/TiN and can be reduced further to ~$3\times10^{-8}$ A/cm$^2$ when increasing the TiO$_2$ thickness from 0.5 to 1 nm.

Remarkably, an improvement in Jg-EOT with RuOx bottom electrode (compared to TiN or Ru BE) is also observed for negative polarity, i.e. for e-injection from the top TiN electrode (FIGS. 15 and 16 (c)). This is an indication of an effect of the BE on the dielectric itself. It is apparent that the leakage in Sr-rich STO films is not controlled by injection barriers from the electrode, but dominated by trap-assisted conduction, with trap energies at ~0.8 eV below the STO conduction band edge, independently of the BE. These observations suggest that the Jg improvement with RuOx BE is likely not related to work function effects, but rather to a change in the trap density distribution within the STO film. A decrease in trap density in the vicinity of the RuOx BE would be consistent with the improvement in leakage being larger for e-injection from this electrode. In order to explain this effect, we consider scavenging effects during crystallization anneal, and associate traps in STO with oxygen deficiency. It is reasonable to assume that oxygen may be scavenged from the STO film to the electrode, for TiN or Ru electrodes. For the case of the Ru electrode oxidized at low temperature and low pressure, however, we note that this leads to formation of RuO$_2$ as well as sub-surface oxygen species, and that oxygen from this surface oxidation can be released towards the STO during the STO crystallization anneal. Thus, we propose that the improvement in STO dielectric quality in the vicinity of the BE, with the oxidized Ru BE, is due to elimination or even reversal of oxygen scavenging by the BE during crystallization anneal, resulting in a lower trap density in STO in vicinity of the BE.

ALD deposited TiO$_2$/Sr-rich STO stacks intermix during crystallization anneal to form a perovskite STO dielectric with tailored (optimized) properties, including k-value tuned (by layer thicknesses) in the 50-100 range and small grain-size, crack-free microstructure, enabling to form capacitors with EOT in the 0.35-0.55 nm range with good electrical properties. Further, the use of this stack approach in combination with oxidized Ru BE results in low leakage capacitors even at aggressively scaled EOTs, with significant leakage reduction compared to TiN or Ru BE. Leakage improvement for both polarities, larger for e-injection from oxidized Ru, is attributed to reduction in trap density in STO in the vicinity of the oxidized Ru BE, in terms attributed to elimination or reversal of oxygen scavenging from the STO to the BE with RuOx BE. As shown, $J_G$ of $10^{-7}$ A/cm2 (at Jg=0.8 V) at 0.4 nm EOT was obtained, making the RuOx/TiO$_2$/STO/TiN stack a top candidate for future (i.e. 3× and further up to 1×) DRAM technology nodes.

The invention claimed is:

1. A method for producing a stack of layers on a semiconductor substrate, the method comprising:
   providing a substrate having a first electrically conductive layer thereon,
   by atomic layer deposition, producing on said first electrically conductive layer a TiO$_2$ layer having a thickness in the range of 0.5 nm to 2 nm; and
   producing on the TiO$_2$ layer a first plurality of layers, the plurality of layers including
      one or more metastable strontium-titanium oxide (STO) layers, each metastable STO layer having a Sr/(Sr+Ti) ratio less than about 58%, each metastable STO layer comprising a plurality of alternating sublayers of amorphous strontium oxide and amorphous titanium oxide, the TiO$_2$ layer being distinct from the one or more metastable STO layers, and
      at least one SrO layer, each SrO layer being distinct from the one or more metastable STO layers, each SrO layer underlying and/or overlying one or more of the metastable STO layers;
   the method further comprising:
      subjecting the substrate including said TiO$_2$ layer and said first plurality of layers to a heat treatment to crystallize the one or more metastable STO layers to form one or more initial crystallized layers and to intermix the at least one TiO$_2$ layer and the at least one SrO layer with the one or more initial crystallized layers, in order to convert the TiO$_2$ layer and the first plurality of layers to a crystallized dielectric STO layer having a cubic perovskite structure on said first electrically conductive layer, and
      producing a second electrically conductive layer on said crystallized dielectric STO layer,
   or
      producing a second electrically conductive layer on said first plurality of layers, and
      subjecting the substrate including said TiO$_2$ layer and said first plurality of layers and said second electrically conductive layer to a heat treatment to crystallize the one or more metastable STO layers to form one or more initial crystallized layers and to intermix the TiO$_2$ layer and the at least one SrO layer with the one or more initial crystallized layers, in order to convert the TiO$_2$ layer and the first plurality of layers to a crystallized dielectric STO layer having a cubic perovskite structure on said first electrically conductive layer.

2. The method according to claim 1, wherein each metastable STO layer has a Sr/(Sr+Ti) ratio between 55% and 65%.

3. The method according to claim 1, wherein said thermal treatment is a thermal anneal at a temperature lower than or equal to 600° C. in an inert atmosphere.

4. The method according to claim 1, wherein the providing the substrate having a first electrically conductive layer thereon comprises providing a layer of ruthenium metal having at its top surface a substantial layer of ruthenium oxide that creates a reservoir of oxygen, and results in release of oxygen from the first electrically conductive layer towards the dielectric during said heat treatment.

5. A metal-insulator-metal (MIM) capacitor made by a method according to claim 1, the MIM capacitor comprising:
   a bottom electrode,
   on said bottom electrode, a layer of STO having a cubic perovskite structure, and
   on said dielectric layer, a top electrode
   wherein the k-value of said dielectric layer is between 50 and 100 and the EOT of the MIM capacitor is between 0.35 nm and 0.55 nm.

6. The method according to claim 1, wherein the crystallized dielectric STO layer on said first conductive layer has an Sr/(Sr+Ti) ratio between 50% and 65%.

7. The method according to claim 1, wherein the crystallized dielectric STO layer on said first electrically conductive layer has an Sr/(Sr+Ti) ratio between 55% and 62%.

8. The method according to claim 1, wherein the crystallized dielectric STO layer on said first electrically conductive layer has an Sr/(Sr+Ti) ratio between 58% and 61%.

9. The method according to claim 1, wherein the crystallized dielectric STO layer on said first electrically conductive layer has an Sr/(Sr+Ti) ratio between about 54% and about 64%.

10. The method according to claim 1, wherein the first electrically conductive layer is produced by a method comprising forming a layer of ruthenium via atomic layer deposition, and subjecting the layer of ruthenium to a low pressure atmosphere consisting of $O_2$ or of a mixture of $O_2$ and one or more inert gases at a partial pressure between 1 mTorr and 10 Torr, at a temperature between 200° C. and 450° C., for a time between 1 min and 30 min, thereby forming a layer of ruthenium having a layer of ruthenium oxide at its top surface.

11. The method according to claim 1, wherein each metastable STO layer has a Sr/(Sr+Ti) ratio in the range of 51-58%.

12. A method for producing a stack of layers on a semiconductor substrate, the method comprising:
   providing a substrate having a first electrically conductive layer thereon, and
   by atomic layer deposition, producing on said first electrically conductive layer a $TiO_2$ layer, the $TiO_2$ layer having a thickness in the range of 0.5 nm to 2 nm; and
   providing on the $TiO_2$ layer one or more layers, the one or more layers including
      one or more metastable strontium-titanium oxide (STO) layers, each metastable STO layer having a Sr/(Sr+Ti) ratio between 55% and 65%, each metastable STO layer comprising a plurality of alternating sublayers of amorphous strontium oxide and amorphous titanium oxide, the $TiO_2$ layer being distinct from the one or more metastable STO layers;
   the method further comprising either:
      a) subjecting the substrate including said $TiO_2$ layer and said one or more layers to a heat treatment to crystallize the one or more metastable STO layers to form one or more initial crystallized layers and to intermix the at least one $TiO_2$ layer with the one or more initial crystallized layers, in order to convert the $TiO_2$ layer and the one or more layers to a crystallized dielectric STO layer on said first electrically conductive layer, and producing a second electrically conductive layer on said crystallized dielectric layer,
   or
      b) producing a second electrically conductive layer on said one or more layers, and subjecting the substrate including said $TiO_2$, layer and said first plurality of layers and said second electrically conductive layer to a heat treatment to crystallize the one or more metastable STO layers to form one or more initial crystallized layers and to intermix the at least one $TiO_2$ layer with the one or more initial crystallized layers, in order to convert the $TiO_2$ layer and the one or more layers to a crystallized dielectric STO layer on said first electrically conductive layer;
   wherein the crystallized dielectric STO layer has a cubic perovskite structure, and
   wherein the Sr/(Sr+Ti) ratio of crystallized dielectric STO layer is less than the Sr/(Sr+Ti) ratio of each of the one or more metastable STO layers of the first plurality of layers.

13. The method according to claim 12, wherein the one or more layers comprises a sequence of alternating $TiO_2$ layers and STO layers or vice versa.

14. The method according to claim 12, wherein said thermal treatment is a thermal anneal at a temperature lower than or equal to 600° C. in an inert atmosphere.

15. The method according to claim 12, wherein the providing the substrate having a first electrically conductive layer thereon comprises providing a layer of ruthenium metal having at its top surface a substantial layer of ruthenium oxide that creates a reservoir of oxygen, and results in release of oxygen from the first electrically conductive layer towards the dielectric during said heat treatment.

16. The method according to claim 12, wherein the one or more metastable STO layers of the first plurality of layers have a Sr/(Sr+Ti) ratio between 58% and 62%.

17. The method according to claim 12, wherein the crystallized dielectric STO layer on said first conductive layer has an Sr/(Sr+Ti) ratio between 50% and 65%.

18. The method according to claim 12, wherein the crystallized dielectric STO layer on said first electrically conductive layer has an Sr/(Sr+Ti) ratio between about 54% and about 64%.

19. The method according to claim 12, wherein the first electrically conductive layer is produced by a method comprising forming a layer of ruthenium via atomic layer deposition, and subjecting the layer of ruthenium to a low pressure atmosphere consisting of $O_2$ or of a mixture of $O_2$ and one or more inert gases at a partial pressure between 1 mTorr and 10 Torr, at a temperature between 200° C. and 450° C., for a time between 1 min and 30 min, thereby forming a layer of ruthenium having a layer of ruthenium oxide at its top surface.

20. A method for producing a stack of layers on a semiconductor substrate, the method comprising:
   providing a substrate having a first electrical conductor thereon, the first electrical conductor comprising a layer of ruthenium having a layer of ruthenium oxide at its top surface, and
   by atomic layer deposition, producing on and in contact with said ruthenium oxide layer a plurality of layers, the plurality of layers comprising
      a $TiO_2$ layer, the $TiO_2$ layer having a thickness in the range of 0.5 nm to 2 nm; and
      one or more metastable strontium-titanium oxide (STO) layers, each metastable STO layer comprising a plurality of alternating sublayers of amorphous strontium oxide and amorphous titanium oxide, wherein the $TiO_2$ layer is distinct from the one or more metastable STO layers;
   the method further comprising either:
      a) subjecting the substrate including said $TiO_2$ layer and said one or more layers to a heat treatment to crystallize the one or more metastable STO layers to form one or more initial crystallized layers and to intermix the at least one $TiO_2$ layer with the one or more initial crystallized layers in order to convert the $TiO_2$ layer and the one or more layers to a crystallized dielectric STO layer on said first electrically conductive layer, and producing a second electrically conductive layer on said crystallized dielectric layer,
   or
      b) producing a second electrically conductive layer on said one or more layers, and subjecting the substrate including said $TiO_2$ layer and said first plurality of layers and said second electrically conductive layer to a heat treatment to crystallize the one or more metastable STO layers to form one or more initial crystallized layers and to intermix the at least one $TiO_2$ layer with the one or more initial crystallized layers in order to convert the $TiO_2$ layer and the one or more layers to a crystallized dielectric STO layer on said first electrically conductive layer;
   wherein the crystallized dielectric STO layer has a cubic perovskite structure, and
   wherein the ruthenium oxide creates a reservoir of oxygen, and results in release of oxygen from the first electrically conductive layer towards the dielectric during said heat treatment.

21. The method according to claim 20, wherein the Sr/(Sr+Ti) ratio of crystallized dielectric STO layer is less than the Sr/(Sr+Ti) ratio of each of the one or more metastable STO layers of the first plurality of layers.

22. The method according to claim 20, wherein the plurality of layers further comprises at least one layer of SrO, the layer of SrO being distinct from the one or more metastable STO layers.

23. The method according to claim 20, wherein the first electrically conductive layer is produced by a method comprising forming a layer of ruthenium via atomic layer deposition, and subjecting the layer of ruthenium to a low pressure atmosphere consisting of $O_2$ or of a mixture of $O_2$ and one or more inert gases at a partial pressure between 1 mTorr and 10 Torr, at a temperature between 200° C. and 450° C., for a time between 1 min and 30 min, thereby forming a layer of ruthenium having a layer of ruthenium oxide at its top surface.

* * * * *